(12) United States Patent
Koizumi et al.

(10) Patent No.: US 7,564,699 B2
(45) Date of Patent: Jul. 21, 2009

(54) PLANAR CIRCUIT HOUSING

(75) Inventors: Daisuke Koizumi, Zushi (JP); Kei Satoh, Yokosuka (JP); Shoichi Narahashi, Yokohama (JP); Tatsuro Masamura, Tokyo (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 11/228,324

(22) Filed: Sep. 19, 2005

(65) Prior Publication Data

US 2007/0223202 A1 Sep. 27, 2007

(30) Foreign Application Priority Data

Sep. 17, 2004 (JP) .............................. 2004-271667

(51) Int. Cl.
*H05K 9/00* (2006.01)
(52) U.S. Cl. ...................... 361/818; 361/800; 361/816; 361/753; 361/799; 361/752; 174/350; 174/377; 174/520
(58) Field of Classification Search ................. 361/760, 361/752, 753, 818, 816, 799, 756, 807, 730, 361/800; 174/260, 50, 520, 350, 377
See application file for complete search history.

(56) References Cited

U.S. PATENT DOCUMENTS

| | | | | |
|---|---|---|---|---|
| 3,910,448 A * | 10/1975 | Evans et al. | ................... | 220/3.8 |
| 4,758,927 A * | 7/1988 | Berg | ......................... | 361/761 |
| 5,111,362 A * | 5/1992 | Flamm et al. | ................ | 361/736 |
| 5,397,857 A * | 3/1995 | Farquhar et al. | ............. | 174/520 |
| 5,493,075 A * | 2/1996 | Chong et al. | ................. | 174/261 |
| 5,544,006 A * | 8/1996 | Radloff et al. | ............... | 361/683 |
| 5,565,656 A * | 10/1996 | Mottahed | .................... | 174/372 |
| 5,566,040 A | 10/1996 | Cosquer et al. | | |
| 5,672,844 A * | 9/1997 | Persson et al. | ............... | 174/387 |
| 5,777,856 A * | 7/1998 | Phillips et al. | .............. | 361/816 |
| 5,782,370 A * | 7/1998 | Kamiya | ..................... | 220/4.02 |
| 5,880,400 A * | 3/1999 | Leischner et al. | ........ | 174/17 CT |
| 5,920,984 A * | 7/1999 | Persson et al. | ................. | 29/836 |
| 6,138,347 A * | 10/2000 | Persson et al. | ................. | 29/836 |
| 6,160,710 A * | 12/2000 | Ahl et al. | ..................... | 361/707 |
| 6,242,690 B1 * | 6/2001 | Glover | ................... | 174/35 GC |
| 6,407,925 B1 * | 6/2002 | Kobayashi et al. | .......... | 361/752 |
| 6,549,429 B2 * | 4/2003 | Konno | ...................... | 363/21.04 |
| 6,626,352 B2 * | 9/2003 | Li | ............................... | 228/245 |
| 6,683,245 B1 * | 1/2004 | Ogawa et al. | ............... | 174/382 |
| 6,816,381 B2 * | 11/2004 | Takeuchi | ..................... | 361/752 |

(Continued)

FOREIGN PATENT DOCUMENTS

CA 2192903 11/1997

(Continued)

*Primary Examiner*—Dameon E Levi
(74) *Attorney, Agent, or Firm*—Oblon, Spivak, McClelland, Maier & Neustadt, P.C.

(57) ABSTRACT

A planar circuit housing (300) for containing a planar circuit (120) is disclosed. The planar circuit housing (300) comprises a support portion (341) for supporting edges of the planar circuit (120), the support portion (341) being provided on at least one housing internal surface substantially perpendicular to the planar circuit substrate (120); an upper cavity (380) in the housing (300) above the planar circuit (120); and a lower cavity (382) in the housing (300) below the planar circuit (120), the lower cavity (382) having the same sizes as the upper cavity (380) in directions parallel with the planar circuit substrate (120).

7 Claims, 7 Drawing Sheets

U.S. PATENT DOCUMENTS

| | | | |
|---|---|---|---|
| 6,927,335 B2 * | 8/2005 | Lim et al. ...................... | 174/50 |
| 7,239,519 B2 * | 7/2007 | Guo et al. ................... | 361/714 |
| 7,508,682 B2 * | 3/2009 | Badarinarayan et al. .... | 361/797 |

FOREIGN PATENT DOCUMENTS

| | | |
|---|---|---|
| CN | 1145571 A | 3/1997 |
| CN | 1087899 C | 7/2002 |
| EP | 0 393 338 | 10/1990 |
| GB | 2 301 944 A | 12/1996 |
| GB | 2 319 397 A | 5/1998 |
| JP | 5-21979 | 1/1993 |
| JP | 7-122876 | 5/1995 |
| JP | 9-307260 | 11/1997 |
| JP | 10-13105 | 1/1998 |
| JP | 10-200287 | 7/1998 |
| JP | 10-200288 | 7/1998 |

* cited by examiner

PLANAR CIRCUIT HOUSING

BACKGROUND OF THE INVENTION

The present invention generally relates to a planar circuit housing for a microwave band planar circuit or a millimeter-wave band planar circuit, and more specially relates to a such a planar circuit housing in which an upper cavity and a lower cavity have the same sizes in direction parallel with the planar circuit substrate.

Figure 1:
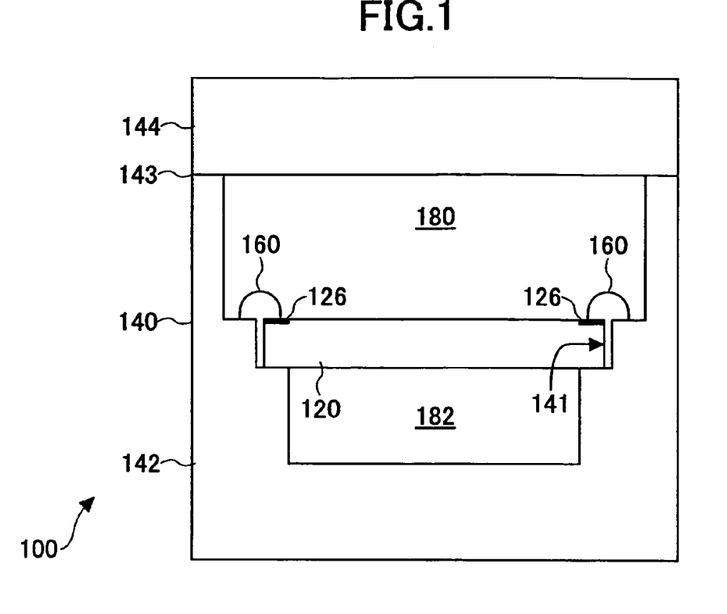
FIG. 1 is a vertical cross-sectional view of a housing for planar circuit.

FIG. 1 shows a vertical cross-sectional view of a housing 100 for a planar circuit. Inside the housing 100, a circuit substrate 120 is mounted as shown in FIG. 1. The circuit substrate 120 is made of dielectric material such as epoxy, ceramics and the like. The top plan shape of the circuit substrate 120 is normally rectangular, but may be circular.

A planar circuit (not shown) is provided on a top surface, a bottom surface or both surfaces of the circuit substrate 120. The planar circuit provided on the circuit substrate 120 includes planar circuits such as filters which can be used for the microwave and millimeter-wave bands and other bands. The planar circuit is normally formed with conductor, but may be formed with thin films using superconductor.

The housing 100 is normally made of metal conductor such as copper. The housing 100 is a box-like body having spaces or cavities 180, 182 therein. An outer surface of the housing 100 can be covered with a gold plating. As shown in FIG. 1, internal walls or surfaces of the housing 100 are provided with two step portion 141. A lower portion of the housing 100 is a base portion 142. A lower surface of the base portion 142 can be contacted to a cooling stage (not shown) to cool the whole housing 100 including the substrate.

A lid 144 covers an upper portion of the housing 100. By removing the lid 144, the circuit substrate 120 can be mounted onto the two step portion 141. After mounting the circuit substrate 120, the lid 144 is mounted on the upper portion of the housing 100 to package.

As shown in FIG. 1, bonding wires 160 are provided for connecting between ground conductors 126 and the two step portion 141 of the housing 100. The bonding wires 160 can be formed of a good conductor such as a gold wire.

In this structure, the planar circuit can be electromagnetically shielded from the outside. An example of such housing is disclosed in Japanese Patent Publication 10-13105.

However, when obtaining the characteristics of such circuit substrate 120 contained in the planar circuit housing 100, there is a problem that it is difficult to prospect undesired waveguide transmission mode generation because that two cavities above and below the circuit substrate have different sizes in length and width.

SUMMARY OF THE INVENTION

A general object of the present invention is to provide a planar circuit housing where cavities in the housing have simple rectangular parallelepiped shapes.

Another object of the present invention is to provide a planar circuit housing where the characteristics of a planar circuit device can be measured or used highly accurately.

Another object of the present invention is to provide a planar circuit housing where a planar circuit substrate is not broken by difference in coefficients of thermal contraction between the housing and the substrate even under cryogenic condition.

According to one aspect of the present invention, a planar circuit housing for containing a planar circuit is provided. The planar circuit housing comprises a support portion for supporting edges of the planar circuit, the support portion being provided on at least one housing internal surface substantially perpendicular to the planar circuit substrate; an upper cavity in the housing above the planar circuit; and a lower cavity in the housing below the planar circuit, the lower cavity having the same sizes as the upper cavity in directions parallel with the planar circuit substrate.

The planar circuit housing may be separated into at least two parts, and their contacting faces are curved or include plural planes.

The planar circuit housing may further comprise a fixing member for resiliently fixing the planar circuit substrate contained in the housing.

The planar circuit housing may further comprise conducting members for electrically connecting conductor portions on the planar circuit substrate contained in the housing to the housing.

In the planar circuit housing, the fixing member may also function as a conducting member for electrically connecting a conductor portion on the planar circuit substrate contained in the housing to the housing.

The planar circuit housing further comprises separation walls for separating the conducting members from the cavities.

In the above planar circuit housing, a lower half may function as a part increasing thermal conduction amount.

In the above planar circuit housing, the support portion is a groove for receiving the edges of the planar circuit.

DESCRIPTION OF THE PREFERRED EMBODIMENTS

The following is a description of embodiments of the present invention, with reference to the accompanying drawings.

Throughout all the figures, members and parts having the same or similar functions are assigned the same or similar reference numerals or symbols, and redundant explanations are omitted.

Housings for planar circuits according to embodiments of the present invention are explained below with reference to the drawings.

First Embodiment

Figure 2:
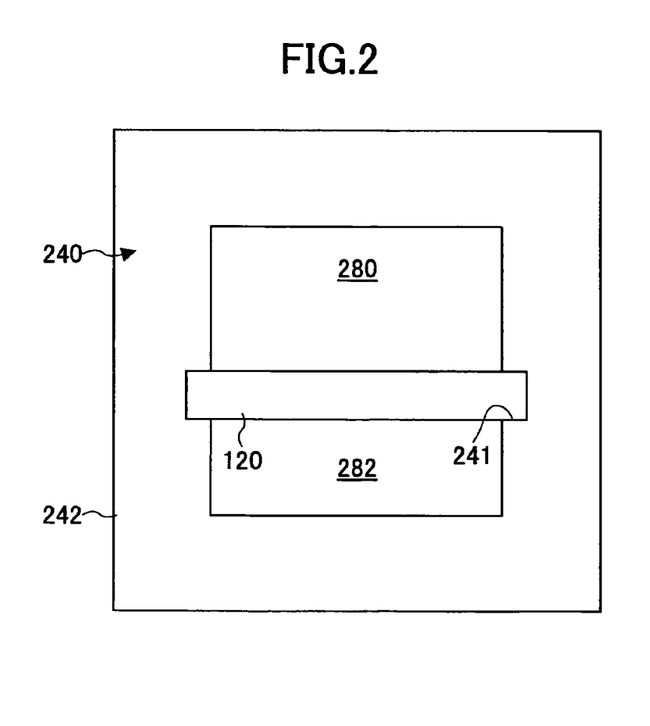
FIG. 2 is a vertical cross-sectional view of a housing for planar circuit according to a first embodiment of the present invention.

FIG. 2 shows a vertical cross-sectional view of a housing 240 for a planar circuit according to a first embodiment of the present invention.

The housing 240 shown in FIG. 2 is normally made of metal conductor such as copper. The housing 240 is a box-like body having spaces or cavities 280, 282 therein. An outer surface of the housing 240 can be covered with a gold plating. As shown in FIG. 2, internal walls or surfaces of the housing 240 have no convexity/concavity such as a step and are simple planes except for a groove 241. Generally, the cavities have a rectangular parallelepiped shape, but may have a cylindrical shape or a polygonal columnar shape or any type of shape.

The internal surfaces have the groove 241 thereon as a support for supporting a planar circuit substrate 120. The groove 241 can receive and support edges of the planar circuit substrate 120. Instead of the groove 241, projections 241' (see FIG. 7) protruding from the internal surfaces of the housing can be formed in order to support the edges of the planar circuit substrate 120. The projections 241' have an adequate length and width, and an adequate number of projections are provided.

A lower half of the housing 240 is a base portion 242, through which the whole housing 240 can be cooled.

The circuit substrate 120 can be fixed by inserting it into the groove 241 provided in the inner walls of the housing 240. The groove 241 can closely contact the circuit substrate 120 to establish an electrical conducting state between the housing 240 and ground conductors (not shown) on the substrate 120.

The circuit substrate 120 can be made of glass epoxy, ceramic, and the like. The top plane of the circuit substrate 120 normally has a rectangular shape, but may have a circular shape. The upper surface, lower surface or both surfaces of the circuit substrate 120 are provided with a planar circuit (not shown). The planar circuit provided on the substrate includes such as filters, which can be utilized for the microwave and millimeter-wave bands. The planar circuit is normally formed using conductor and may be formed using thin films of high temperature super-conductor.

In this embodiment, the upper cavity 280 above the upper surface of the circuit substrate 120 and the lower cavity 282 below the lower surface of the circuit substrate 120 have equal size in their widths (lengths in the horizontal direction in the plane of the paper face in the figure). The upper cavity 280 above the upper surface of the circuit substrate 120 and the lower cavity 282 below the lower surface of the circuit substrate 120 have equal size in their depths (lengths in the horizontal direction perpendicular to the plane of the paper face in the figure). In this manner, the upper cavity and the lower cavity have equal sizes in the directions parallel with the planar circuit substrate, and analyzed regions of the cavities become simple rectangular parallelepiped. As a result, it becomes easier to analyze the cavities and their analytical conditions become substantially identical with the actual measurement conditions.

Second Embodiment

The housing 240 according to the first embodiment may have a simple removable roof member in order to perform packaging. However, if contacting faces of the housing and the roof are simple flat planes 143 as shown in FIG. 1, it is comparatively easy for an electromagnetic wave to penetrate to or invade the inside, which is a problem. This problem can be solved by a second embodiment, which is explained below with reference to FIGS. 3A and 3B.

Figure 3A:
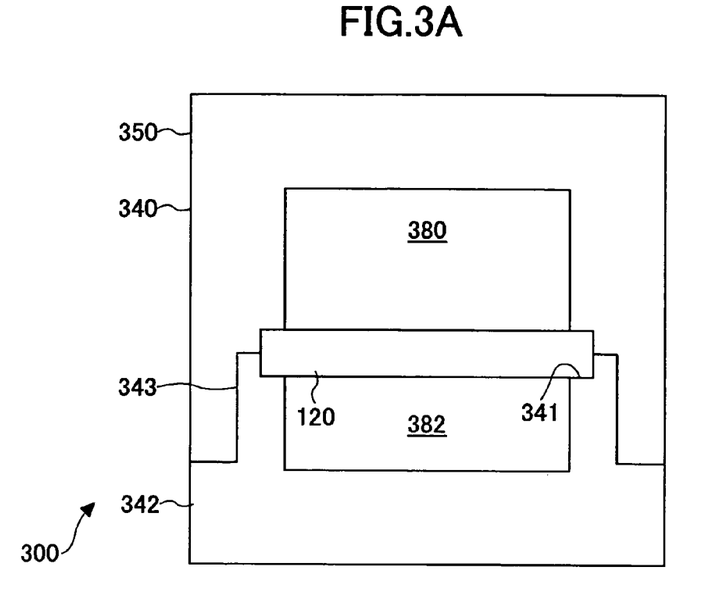
FIG. 3A is a vertical cross-sectional view of a housing for planar circuit according to a second embodiment of the present invention.
Figure 3B:
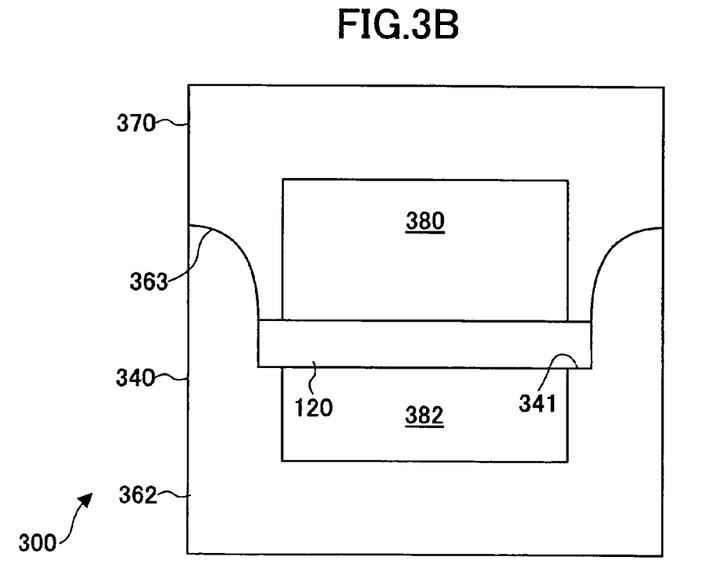
FIG. 3B is a vertical cross-sectional view of a housing for planar circuit according to a second alternative embodiment of the present invention.

FIGS. 3A and 3B show vertical cross-sectional views of housings 340 according to the second embodiment of the present invention.

The housing 340 shown in FIG. 3A is substantially the same as the housing 240 shown in FIG. 2, and therefore only different portions of the housing 340 shown in FIG. 3A are explained. The housing 340 is assembled using two parts or more such as a housing lower half 342 and a housing upper half 350. The contacting portion or face between the housing lower half 342 and the housing upper half 350 lies at a groove 341 for receiving a planar circuit substrate 120, and has a crank cross-sectional shape having one step (plural planes) as shown in FIG. 3A. The shape of the contacting portion is not limited to one step, but may have any number of steps. The more steps, the more complicated its structure, but the more effectively an external electromagnetic wave is prevented from penetrating into the inside.

The housing 340 shown in FIG. 3B is substantially the same as the housing 240 shown in FIG. 2, and therefore only different portions of the housing 340 shown in FIG. 3B are explained. The housing 340 is assembled using two parts or more such as a housing lower half 362 and a housing upper half 370. The contacting portion or face between the housing lower half 362 and the housing upper half 370 lies at a groove 341 for receiving a planar circuit substrate 120, and has a curved shape as shown in FIG. 3B.

This labyrinth structure can effectively prevent an external electromagnetic wave from penetrating into the inside and also can prevent internal energy from leaking to the outside.

These contacting faces can be located anywhere in the housings and can have any type of shape such as curved faces and plural flat faces.

Third Embodiment

The housings 240 and 340 according to the first and second embodiments are preferable when used under constant temperature conditions. However, in order to use or measure the planar circuit under cryogenic conditions, the whole housing including the planar circuit substrate 120 should be cooled. When the whole housing is cooled, a difference between the planar circuit substrate and the housing material in their coefficients of thermal expansion makes a problem. The circuit substrate 120 and the groove 241 or 341 of the housing are in closely contact with each other without a gap at room temperature. The housing has a coefficient of thermal contraction larger than that of the circuit substrate 120. While cooling down the housing, the housing may push and crush the planar circuit substrate. This problem can be solved by a third embodiment, which is explained below with reference to FIGS. 4A and 4B.

Figure 4A:
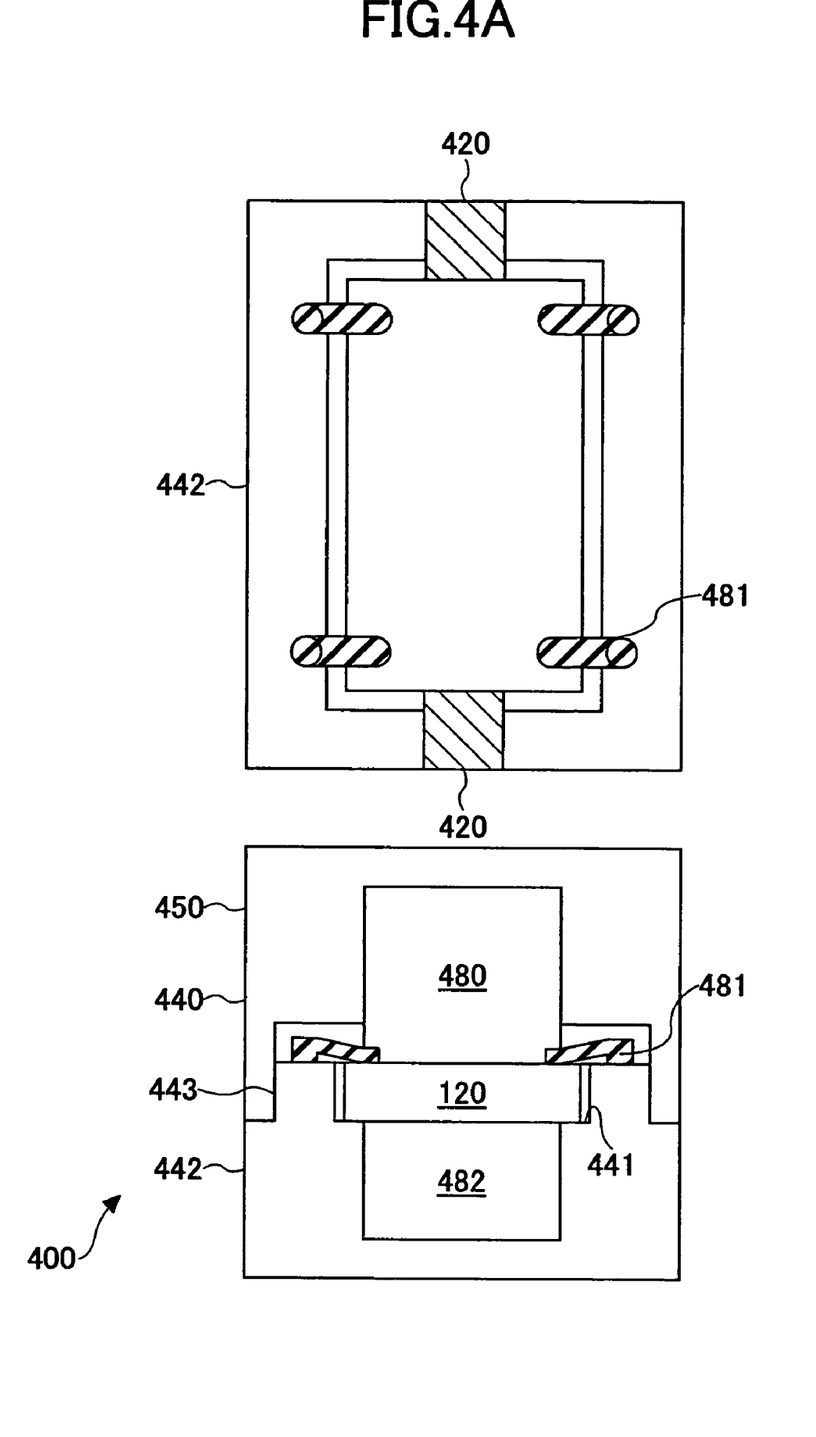
FIG. 4A shows a top plan view of a lower half of a housing according to a third embodiment of the present invention and a vertical cross-sectional view of the housing.

FIG. 4A shows a top plan view of a lower half 442 of a housing 440 according to a third embodiment of the present invention. FIG. 4A further shows a vertical cross-sectional view of the housing 440 according to the third embodiment.

Figure 4B:
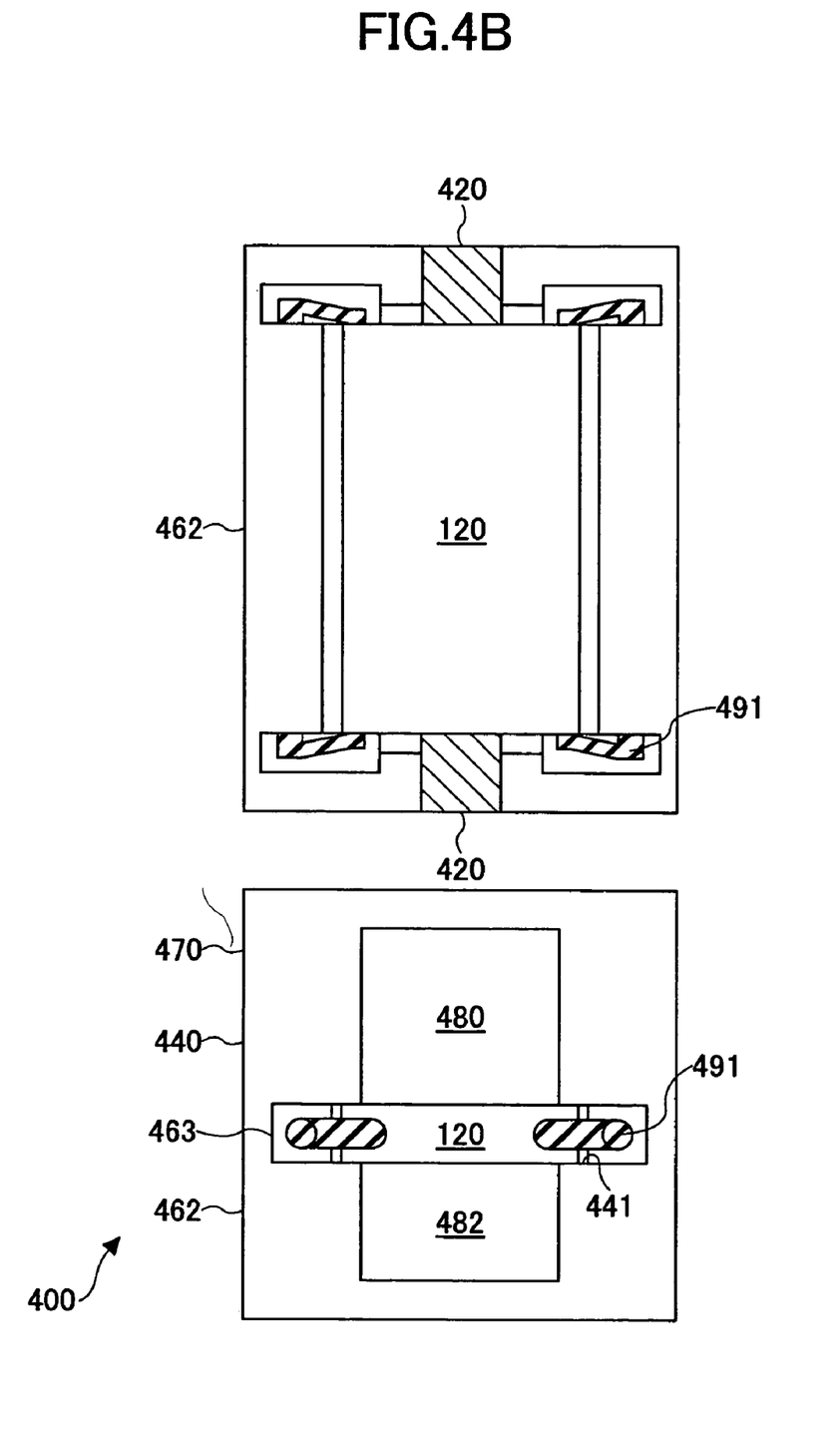
FIG. 4B shows a top plan view of a lower half of a housing according to a third alternative embodiment of the present invention and a vertical cross-sectional view of the housing.

The housing 440 shown in FIGS. 4A and 4B is substantially the same as the housing 340 shown in FIG. 3A, and therefore only different portions of the housing 440 shown in FIGS. 4A and 4B are explained. The housing 440 for a planar circuit comprises a housing upper half 450 and the housing lower half 442. A contacting face between the housing upper half 450 and the housing lower half 442 is provided at a groove 441 for receiving a planar circuit substrate 120. The horizontal length of the groove 441 is designed so as to leave space between the edges of the circuit substrate 120 and the innermost walls of the groove 441 at room temperature, in order not to crush the circuit substrate 120 under cryogenic conditions. The height (vertical length) of the groove 441 is designed so as to coincide with the height of the planar circuit substrate 120 under cryogenic conditions. In this case, the height of the groove 441 is greater than that of the planar circuit substrate 120 at room temperature, and therefore the groove 441 cannot surely fix the planar circuit substrate 120 received in the housing 440 at room temperature.

Then, a fixing member is desired in the housing 440, for resiliently fixing the planer circuit substrate 120 while cooling down the housing 440 to a desired low temperature. In the third embodiment shown in FIG. 4A, the housing 440 is provided with fixing members 481 that resiliently and vertically press down on an upper face of the planar circuit substrate 120 and fix it. In the third alternative embodiment shown in FIG. 4B, the housing 440 is provided with fixing members 491 that resiliently and horizontally press side faces of the planar circuit substrate 120 and fix it. Both the fixing members 481 and 491 are provided in plural numbers. The embodiments shown in FIGS. 4A and 4B have four fixing members. The fixing member can be an elastic body such as a leaf spring or plate spring, and can be of a biasing type using a coil spring and the like. The fixing member can be a conductor; in that case it can also function as wire bonding. Members 420 are connecting terminals for connecting the planar circuit.

In this structure, even if the housing 440 changes its size by thermal expansion or thermal contraction due to temperature change, the planar circuit substrate 120 is not broken and can be measured or utilized.

The number of members constituting the housing 440 is not limited to two. The contacting face between the upper and lower halves of the housing 440 can be placed anywhere, and the number, place, and orientation of the fixing members are not limited to any specific situation. Those variations are all included by the scope of the present invention.

Fourth Embodiment

Figure 5A:
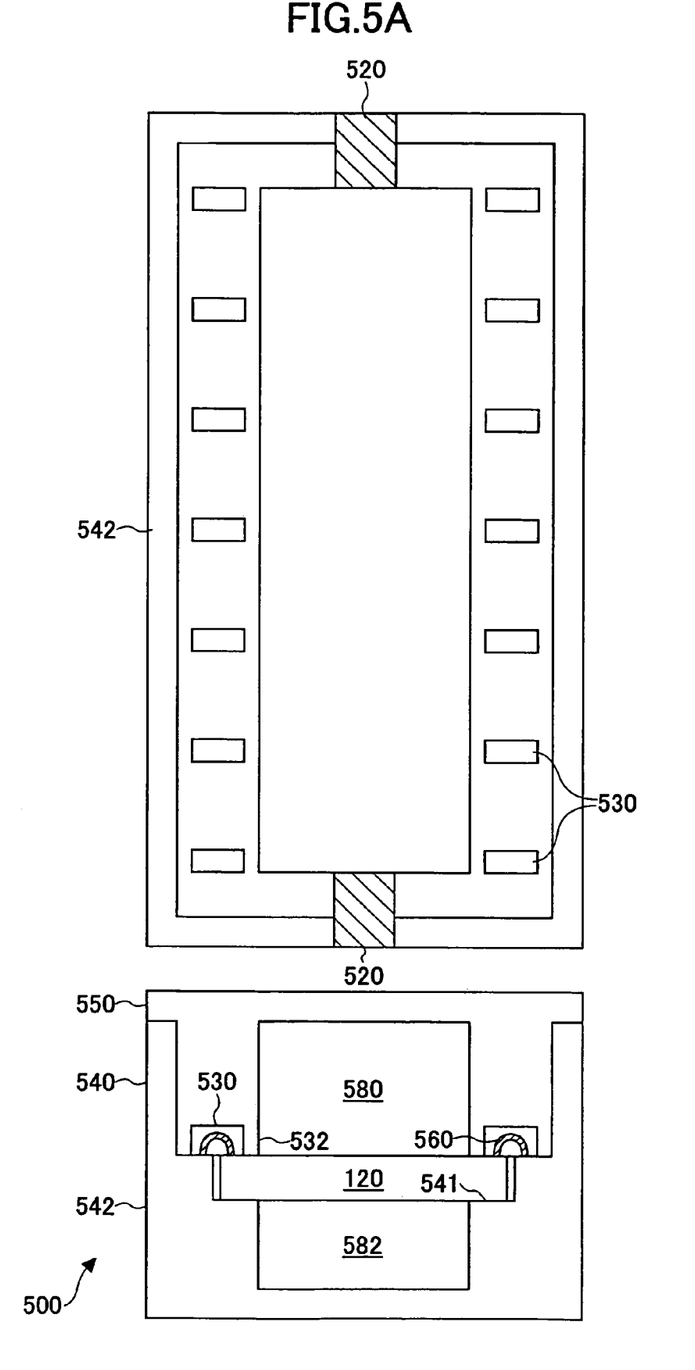
FIG. 5A shows a top plan view of a lower half of a housing according to a fourth embodiment of the present invention and a vertical cross-sectional view of the housing.
Figure 5B:
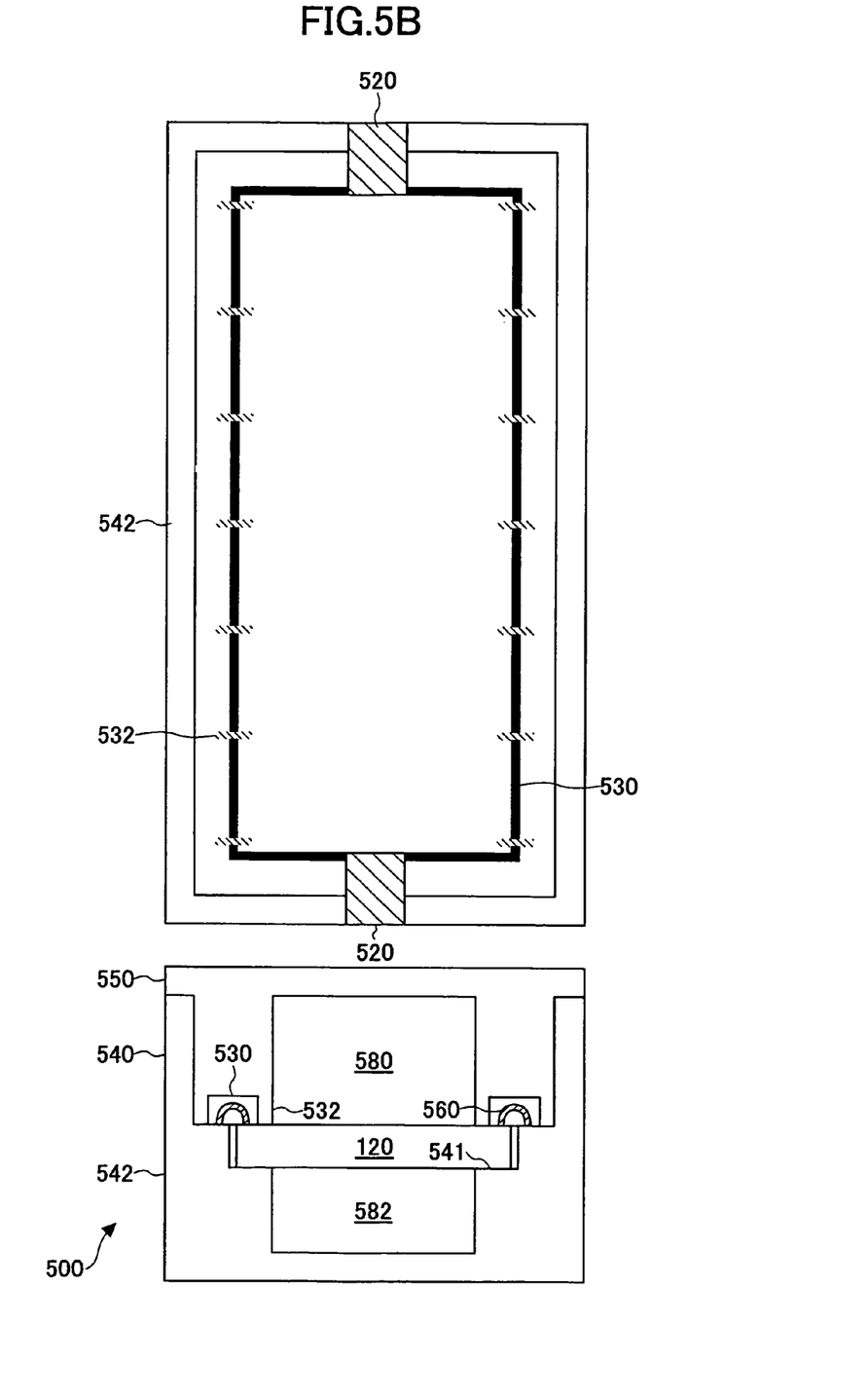
FIG. 5B shows a top plan view of a lower half of a housing according to a fourth alternative embodiment of the present invention and a vertical cross-sectional view of the housing.

FIG. 5A shows a top plan view of a lower half 542 of a housing 540 and a vertical cross-sectional view of the housing according to a fourth embodiment of the present invention. FIG. 5B shows a top plan view of a lower half 542 of a housing 540 and a vertical cross-sectional view of the housing 540 according to a fourth alternative embodiment.

When utilizing or measuring such a planar circuit under cryogenic conditions, the whole housing including the planar circuit substrate 120 should be cooled. As temperature of the housing changes, the relative position of the planar circuit substrate 120 against the housing 540 may be changed due to thermal expansion or thermal contraction. Even in this situation, ground conductors on the planar circuit substrate 120 should be surely connected to the housing 540. For this purpose, in the housing 540 for planar circuit according to the fourth embodiment, conducting members 560 such as bonding wires are provided between the housing 540 and the ground conductors on the planar circuit substrate 120.

Separation walls 532 made of the housing material are provided between a cavity 580 and concave portions 530 in order to separate the concave portions 530 containing the conducting members 560 from the cavity 580 so that the concave portions 530 do not affect the isolated waveguide shape. In FIG. 5A, the concave portion 530 receiving the conducting members 560 comprises a plurality of slots (concave shapes). In FIG. 5B, the concave portion 530 receiving the concave portions 530 comprises a continuous groove surrounding the circuit substrate 120.

In this structure, even when the whole housing changes its temperature, measurement can be done while keeping the housing 540 and the ground conductors on the planar circuit substrate 120 at the same electrical potential and maintaining the rectangular parallelepiped shape of the cavities 580 and 582. Terminals 520 connected to the planar circuit substrate 120 can be provided. The place or number of the conducting members 560 is not limited to that shown in FIGS. 5A and 5B.

Fifth Embodiment

Figure 6:
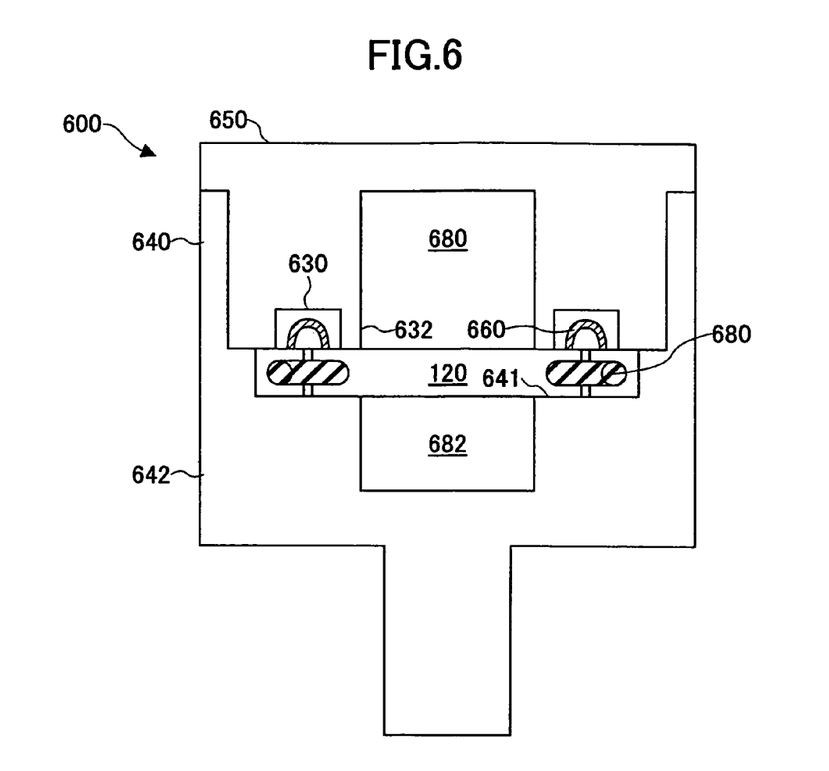
FIG. 6 is a vertical cross-sectional view of a housing for planar circuit according to a fifth embodiment of the present invention.

FIG. 6 shows a vertical cross-sectional view of a housing 640 according to the fifth embodiment of the present invention.

The housing 640 according to the fifth embodiment includes all features explained in the second embodiment, the third embodiment and the fourth embodiment. The housing 640 can solve a thermal conducting resistance problem at a contacting face between a base portion 642 and a cooling stage, which occurs when the planar circuit substrate 120 is used or measured under cryogenic conditions. In the housing 640, the housing base portion 642 is formed integrally with the cooling stage to remove the contacting face between them and the thermal conduction amount can be improved.

In this manner, the housing 640 and the circuit substrate 120 therein can linearly follow the temperature change of the cooling stage, compared with the box-like housings shown in FIGS. 2 through 5.

Figure 7:
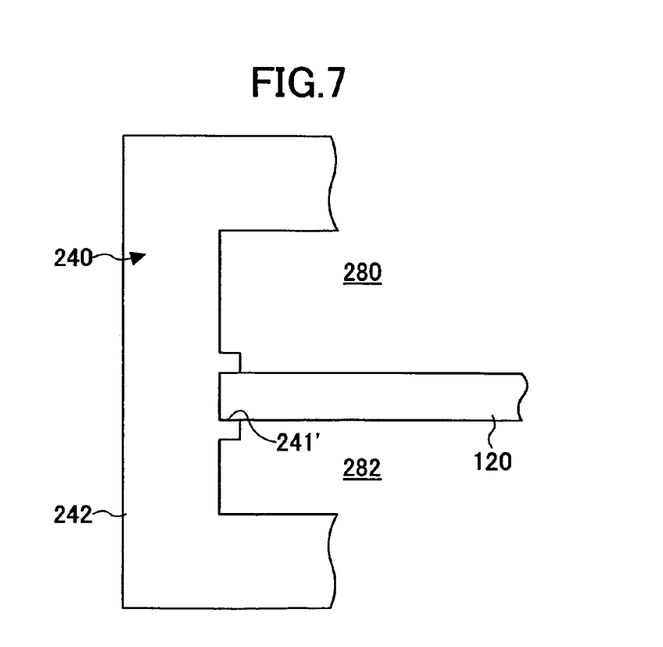
FIG. 7 is a vertical cross-sectional view of a housing for planar circuit according to a first alternative embodiment of the present invention.

In some of the above embodiments, the grooves are used for supporting the planar circuit substrate 120. However, the present invention is not limited to grooves and may have a projecting type support as shown in FIG. 7. The support member for supporting the planar circuit substrate can be of any type within the scope of the present invention.

INDUSTRIAL APPLICABILITY

Planar circuit housings according to the present invention can be utilized for packaging microwave band planar circuits and millimeter-wave planar circuits and other planar circuits. Packaged planar circuits can be utilized in communications equipment.

The present application is based on Japanese Priority Application No. 2004-271667 filed on Sep. 17, 2004 with the Japanese Patent Office, the entire contents of which are hereby incorporated by reference.

What is claimed is:

1. A planar circuit housing for containing a planar circuit, comprising:
    a support portion for supporting only surrounding edges of the planar circuit, the support portion being provided only on a housing internal surface that is substantially perpendicular to the planar circuit substrate;
    an upper cavity in the housing above the planar circuit; and a lower cavity in the housing below the planar circuit, the lower cavity having the same sizes as the upper cavity in directions parallel with the planar circuit substrate, wherein internal surfaces of the housing have no convexity or concavity except for the support portion; and the housing is made entirely of a solid conductor and is separated into at least two conductor body parts, the at least two conductor body parts having contacting conductor faces, and the contacting conductor faces consist of only a single curved plane all around the planar circuit substrate so as to prevent penetration of electromagnetic waves.

2. The planar circuit housing as claimed in claim 1, further comprising:

a fixing member for resiliently fixing the planar circuit substrate contained in the housing.

3. The planar circuit housing as claimed in claim 1, further comprising:

conducting members for electrically connecting conductor portions on the planar circuit substrate contained in the housing to the housing.

4. The planar circuit housing as claimed in claim 2, wherein:

the fixing member also functions as a conducting member for electrically connecting a conductor portion on the planar circuit substrate contained in the housing to the housing.

5. A planar circuit housing for containing a planar circuit, comprising:

a support portion for supporting only surrounding edges of the planar circuit, the support portion being provided only on a housing internal surface substantially perpendicular to the planar circuit substrate;

an upper cavity in the housing above the planar circuit; and a lower cavity in the housing below the planar circuit, the lower cavity having the same sizes as the upper cavity in directions parallel with the planar circuit substrate, wherein the internal surfaces of the housing have no convexity or concavity except for the support portion; and the housing is made entirely of a solid conductor and is separated into at least two conductor body parts, the at least two conductor body parts having contacting conductor faces, and the contacting conductor faces consist of only a single curved plane all around the planar circuit substrate so as to prevent penetration of electromagnetic waves, wherein the planar circuit housing further includes:

conducting members for electrically connecting conductor portions on the planar circuit substrate contained in the housing to the housing; and separation walls for separating the conducting members from the cavities.

6. The planar circuit housing as claimed in claim 1, wherein:

a lower half is a base portion for increasing a thermal conduction amount.

7. A planar circuit housing for containing a planar circuit, comprising:

a support portion for supporting only surrounding edges of the planar circuit, the support portion being provided only on a housing internal surface substantially perpendicular to the planar circuit substrate;

an upper cavity in the housing above the planar circuit; and a lower cavity in the housing below the planar circuit, the lower cavity having the same sizes as the upper cavity in directions parallel with the planar circuit substrate, wherein the internal surfaces of the housing have no convexity or concavity except for the support portion; and the housing is made entirely of a solid conductor and is separated into at least two conductor body parts, the at least two conductor body parts having contacting conductor faces, and the contacting conductor faces consist of only a single curved plane all around the planar circuit substrate so as to prevent penetration of electromagnetic waves, wherein the support portion is a groove between two projections for receiving the edges of the planar circuit.

* * * * *